(12) United States Patent
Kronholz et al.

(10) Patent No.: US 8,623,742 B2
(45) Date of Patent: Jan. 7, 2014

(54) REDUCED STI LOSS FOR SUPERIOR SURFACE PLANARITY OF EMBEDDED STRESSORS IN DENSELY PACKED SEMICONDUCTOR DEVICES

(75) Inventors: Stephan Kronholz, Dresden (DE); Matthias Kessler, Dresden (DE); Thomas Feudel, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 215 days.

(21) Appl. No.: 13/079,341

(22) Filed: Apr. 4, 2011

(65) Prior Publication Data
US 2011/0269293 A1    Nov. 3, 2011

(30) Foreign Application Priority Data

Apr. 30, 2010 (DE) .......................... 10 2010 028 464

(51) Int. Cl.
*H01L 21/76*    (2006.01)

(52) U.S. Cl.
USPC ....... 438/429; 438/421; 438/424; 257/E21.54

(58) Field of Classification Search
USPC .......................................... 438/421, 424, 429
See application file for complete search history.

(56) References Cited

U.S. PATENT DOCUMENTS

| | | | |
|---|---|---|---|
| 2008/0217729 A1* | 9/2008 | Disney et al. ................. | 257/513 |
| 2011/0269293 A1* | 11/2011 | Kronholz et al. ............. | 438/421 |
| 2011/0306170 A1* | 12/2011 | Wang et al. ................... | 438/197 |

* cited by examiner

*Primary Examiner* — Alexander Ghyka
(74) *Attorney, Agent, or Firm* — Williams, Morgan & Amerson, P.C.

(57) ABSTRACT

A reduction in material loss of trench isolation structures prior to forming a strain-inducing semiconductor alloy in transistor elements may result in superior device uniformity, for instance with respect to drive current and threshold voltage. To this end, at least one etch process using diluted hydrofluoric acid may be omitted when forming the shallow trench isolations, while at the same time providing a high degree of compatibility with conventional process strategies.

11 Claims, 11 Drawing Sheets

REDUCED STI LOSS FOR SUPERIOR SURFACE PLANARITY OF EMBEDDED STRESSORS IN DENSELY PACKED SEMICONDUCTOR DEVICES

BACKGROUND OF THE INVENTION

1. Field of the Invention

Generally, the present disclosure relates to the field of integrated circuits, and, more particularly, to field effect transistors and manufacturing techniques, in which an embedded strain-inducing semiconductor material is used for performance enhancement of the transistors.

2. Description of the Related Art

Integrated circuits typically include a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips, graphic devices and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Hence, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

On the other hand, the continuous shrinkage of the gate length of planar transistor configurations may typically result in very sophisticated topographical configurations, since the gate height may not be proportionally reduced in relation to the gate length, unless very complicated process strategies are used for maintaining the desired overall gate conductivity and the ion blocking effect during the formation of drain and source regions of the transistors in which the gate electrode, in combination with a spacer structure, typically acts as an implantation mask. Consequently, upon further reducing the gate length in order to improve performance of the individual transistors and also increase overall packing density of the semiconductor devices, the space between neighboring gate electrode structures may also be reduced. In advanced approaches, the performance of closely spaced transistors may, however, strongly depend on the overall manufacturing strategy, in particular when additional performance enhancing mechanisms are implemented in one or both types of transistors. For example, for a given gate length of field effect transistors, the performance thereof may be further increased by inducing a certain type of strain in the channel region of the transistors, which may have a strong effect on the resulting charge carrier mobility. For a standard crystallographic configuration, a compressive strain component in the channel region of P-channel transistors may significantly enhance the overall drive current capability due to an increase of the mobility of holes, which represent the dominant charge carriers in P-channel transistors. Similarly, a tensile strain component in N-channel transistors may result in a significant increase of electron mobility, thereby also improving the drive current capability. One efficient mechanism for increasing the strain locally in P-channel transistors is the incorporation of a strain-inducing semiconductor alloy, such as a silicon/germanium alloy, which may result in a significant compressive strain component. For this purpose, cavities may be selectively formed in the active regions of the P-channel transistors after the patterning of the basic gate electrode structures and the cavities may be refilled with a crystalline silicon/germanium alloy, which may be grown on the remaining silicon base material, thereby obtaining the desired compressive strained state.

These sophisticated strain-inducing mechanisms may enable forming transistors of reduced dimensions, while, nevertheless, preserving a certain minimum thickness of the silicon dioxide based gate dielectric material in order to keep the resulting leakage currents at an acceptable level. It is well known that reducing, for instance, the gate length of field effect transistors may be associated with the requirement of increasing the capacitive coupling of the gate electrode to the channel region in order to provide an appropriate controllability of the current flow in the channel region. Typically, the increased capacitive coupling may be accomplished by reducing the thickness of the gate dielectric material, which is typically provided in the form of a silicon dioxide based material due to the superior characteristics of a silicon dioxide/silicon interface.

Recently, a plurality of process strategies and device architectures have been proposed in an attempt to replace the well-established silicon dioxide based gate dielectric material with sophisticated material systems, which have a high dielectric constant and, thus, provide superior capacitive coupling for a given physical layer thickness. Although many of these approaches may represent promising strategies, nevertheless, providing transistors on the basis of efficient internal strain-inducing mechanisms still provides the possibility of forming powerful semiconductor devices including field effect transistors having critical dimensions of 50 nm and less, while, however, avoiding the incorporation of very complex material systems and process strategies, as are typically associated with the introduction of high-k dielectric materials in combination with metal-containing electrode materials.

Although, for instance, the incorporation of a strain-inducing silicon/germanium alloy in the active region of P-channel transistors is a very efficient strategy for enhancing drive current and switching speed of the P-channel transistors, significant variations of transistor characteristics have been observed in sophisticated semiconductor devices. For example, the drive current of P-channel transistors, which have incorporated therein a strain-inducing silicon/germanium alloy, may exhibit significant variations across single die areas, wherein, in particular, significant differences may exist between very dense device areas and areas of reduced packing density. Typically, in complex semiconductor devices, a plurality of circuit portions may have to interact with each other, wherein the various operating speeds may have to be matched to each other in order to provide a proper functional behavior of the total circuitry. For this reason, the operating conditions of certain circuit portions may have to be adjusted so as to work at reduced performance in order to match the operating capabilities of other device portions, thereby providing, in total, a semiconductor device of reduced performance. Consequently, improving uniformity of drive current capabilities of, in particular, P-channel transistors would provide superior conditions upon targeting complex integrated circuits and generally classifying the finished semiconductor devices. Further-more, in addition to a significant variation of the saturation currents of P-channel transistors, a pronounced variation of the threshold voltage has also been observed across semiconductor dies, which may also result in a significantly reduced number of high performance devices for a given product technology and process strategy.

Figure 1A:
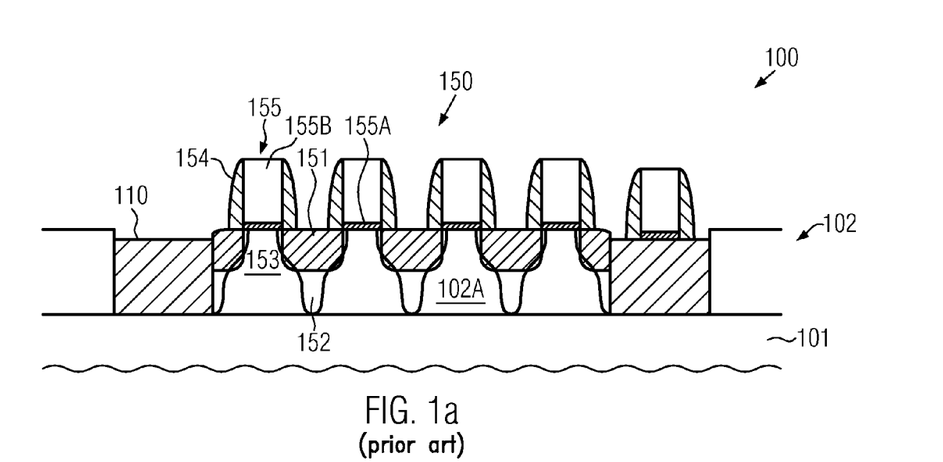
FIGS. 1a-1b schematically illustrate cross-sectional views of a semiconductor device comprising a plurality of P-channel transistors in active regions having formed therein a strain-inducing semiconductor alloy and being laterally delineated by shallow trench isolations formed on the basis of a conventional process strategy.
Figure 1B:
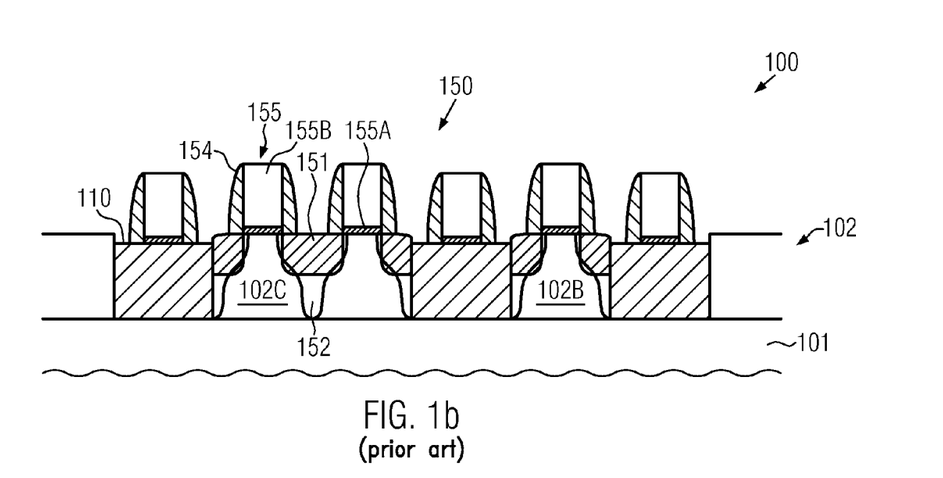

With reference to FIGS. 1a-1b, a typical process strategy and semiconductor devices including P-channel transistors having incorporated therein a strain-inducing silicon/germanium alloy will be described in more detail, in order to identify critical process stages.

FIG. 1a schematically illustrates a cross-sectional view of a semiconductor device 100 comprising a substrate 101 and a semiconductor layer 102, which typically represents a silicon-based semiconductor material, at least in an initial state, prior to forming circuit elements in the semiconductor layer 102. The semiconductor device 100 may represent a silicon-on-insulator (SOI) device, in which a buried insulating layer (not shown) may be formed between the substrate 101 and the semiconductor layer 102. In other cases, the silicon-based semiconductor layer 102 is a part of a crystalline semiconductor material of the substrate 101 and may represent a "bulk" configuration. In the manufacturing stage shown, a shallow trench isolation region or structure 110 is formed in the semiconductor layer 102 and extends down to a specific depth, for instance several ten of nanometers, depending on the device requirements. In SOI architectures, the shallow trench isolation 110 typically extends down to the buried insulating layer. The isolation structure 110, thus, laterally delineates an active region 102A in the semiconductor layer 102 and, thus, defines the lateral size and position of the active region 102A. It should be appreciated that, typically, a plurality of active regions are provided in the device 100 on the basis of the isolation structure 110. To this end, the isolation structure 110 may comprise appropriately dimensioned isolation trenches, which may have a width of 100 nm and less, between two different active regions in densely packed device areas, while, in other cases, trenches having a width of several hundred nanometers and more may be provided in the structure 110, for instance when requiring extended isolation regions and the like. The trench isolation 110 may be comprised of silicon dioxide material, which is a well-established dielectric material in semiconductor devices due to the superior interface characteristics of silicon dioxide and silicon, as discussed above.

In the example shown in FIG. 1a, the active region 102A, which may be understood as a semiconductor region having formed therein or receiving PN junctions for at least one transistor element, comprises drain and source regions 152 of a plurality of transistors 150, which represent P-channel transistors in the example shown. Moreover, as previously discussed, strain-inducing silicon/germanium regions 151 may be provided in the active region 102A laterally adjacent to gate electrode structures 155 in order to induce uniaxial strain in channel regions 153, thereby significantly increasing charge carrier mobility in the channel regions 153, which may, thus, provide superior drive current and switching speed of the transistors 150. Moreover, in the manufacturing stage shown, the gate electrode structures 155, which may comprise a gate dielectric material 155A, for instance in the form of a silicon dioxide based material, such as a nitrogen-enriched silicon dioxide material, and a polysilicon material 155B, may have formed on sidewalls thereof a spacer structure 154. As previously discussed, the gate electrode structures 155 may have a length, i.e., in FIG. 1a, the horizontal direction, which also represents the current flow direction in the channel regions 153, of 50 nm and less, which may generally provide fast and powerful semiconductor devices on the basis of conventional materials, such as silicon dioxide based gate dielectrics and a polysilicon electrode material for the gate electrode structures 155.

FIG. 1b schematically illustrates the semiconductor device 100, wherein transistors 150 may be provided in active regions 102B, 102C, which may have a reduced length compared to the active region 102A as shown in FIG. 1a. Consequently, in this case, a reduced number of transistors may be provided in each of the active regions 102B, 102C, while, on the other hand, the overall basic configurations of the transistors 150 may be identical for the active regions 102A, 102B and 102C.

The semiconductor device 100 as shown in FIGS. 1a and 1b may be formed on the basis of the following process techniques. The shallow trench isolation 110 may be formed in the semiconductor layer 102 by applying sophisticated lithography techniques in order to form an etch mask, which may then be used for patterning the semiconductor layer 102 so as to form appropriate trenches therein, in accordance with requirements for the lateral configuration of the isolation structure 110. Thereafter, silicon dioxide material may be deposited so as to refill the trenches, and any excess material may be removed by chemical mechanical polishing (CMP), followed by the removal of the etch mask. Thereafter, a plurality of well implantation processes may be performed on the basis of an appropriate masking regime in order to incorporate a dopant species for adjusting the basic characteristics of the transistors 150, for instance in terms of threshold voltage and the like. For example, typically, different threshold voltages may be required for basically the same transistor configuration, which may require two or more implantation steps so as to obtain different "flavors" of the same transistor type. Next, the gate electrode structures 155 are formed by providing the gate dielectric material 155A and the electrode material 155B in combination with a dielectric cap material and any further materials, such as hard mask materials, and the like, which are then patterned in accordance with the design rules of the device 100 based on sophisticated lithography and etch techniques. Thereafter, an appropriate spacer structure may be provided so as to form cavities in the active region 102A, while any other active regions may be covered by a mask material, which may also act as an appropriate mask during the refilling of the cavities by means of a selective epitaxial growth process for providing the silicon/germanium material 151. Next, the drain and source regions 152 in combination with the spacer structure 154 may be formed on the basis of any appropriate process technique, followed by any anneal processes in order to adjust the final dopant profile of the drain and source regions 152.

Upon operating the device 100, it has been observed that the transistor characteristics may vary across the semiconductor device 100 and may even vary within individual active regions, such as the active region 102A as shown in FIG. 1a.

For example, it has been recognized that transistors positioned immediately at the shallow trench isolation 110 may have a reduced performance compared to transistors which are not laterally adjacent to the isolation structure 110. Similarly, in total, the transistors 150 of FIG. 1b, which may be provided on the basis of the active regions 102C, 102B having a reduced length, may have a reduced performance compared to the entirety of the transistors 150 in the active region 102A. Thus, although the silicon/germanium alloy 151 may provide, in principle, superior transistor performance, the incorporation of the material 151 may also result in significant performance variations across the entire device and also within individual device areas, for instance with respect to transistors being positioned adjacent to a shallow trench isolation and transistors that are not positioned adjacent to a trench isolation region.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques, in which transistors of reduced critical dimensions, for instance having a gate length of 50 nm and less, may be provided on the basis of strain-inducing mechanisms using an embedded strain-inducing semiconductor alloy, such as a silicon/germanium material, a silicon/carbon material and the like, while at the same time providing superior uniformity of the transistor characteristics. To this end, the material loss in shallow trench isolations prior to providing the strain\-inducing semiconductor material in the active regions of the transistors may be reduced, thereby providing more uniform process conditions and a more uniform device topography upon growing the strain-inducing semiconductor alloy. Without intending to restrict the present application to the following explanation, it is assumed that the pronounced material loss and, thus, the recessing of the shallow trench isolations may result in an inferior topography of the strain-inducing semiconductor alloy in the vicinity of the shallow trench isolation, which may, thus, result in a lower gain in performance of the corresponding transistors positioned adjacent to the shallow trench isolation regions. A significant loss of material in the isolation regions may be caused by etch and cleaning recipes based on diluted hydrofluoric acid (HF). For this reason, in some illustrative aspects disclosed herein, the total amount of hydrofluoric acid used during a process interval prior to forming the strain-inducing semiconductor alloy may be significantly reduced, thereby also restricting the material loss in the isolation regions. For example, the process for removing a silicon dioxide sub-layer of an etch mask used for etching the isolation trenches into the semiconductor layer and the subsequent provision of an oxide layer for performing well implantation processes and the subsequent removal thereof have been identified as major sources for a pronounced material loss in the isolation structure. For this reason, superior process strategies have been developed, however, without unduly modifying the entire process flow, in order to significantly improve the lithography of the isolation structures.

One illustrative method disclosed herein comprises forming an isolation trench in a semiconductor layer of a semiconductor device by using a hard mask that comprises a first mask layer and a second mask layer. The method further comprises forming a shallow trench isolation region for delineating an active region in the semiconductor layer by filling the isolation trench with a dielectric material and removing an excess portion of the dielectric material by performing a removal process using the second mask layer as a stop layer. Additionally, the method comprises removing the second mask layer so as to expose the first mask layer. Moreover, at least one well implantation process is performed in the presence of the first mask layer. The method further comprises forming a gate electrode structure on the active region after removal of the first mask layer. Additionally, a strain-inducing semiconductor alloy is formed in a portion of the active region.

A further illustrative method disclosed herein relates to forming a semiconductor device. The method comprises forming a mask layer stack on a semiconductor layer and forming an etch mask from the mask layer stack. The method further comprising forming a shallow trench isolation structure in the semiconductor layer by using the etch mask so as to laterally delineate an active region in the semiconductor layer. Additionally, the method comprises incorporating a well dopant species into the active region in the presence of at least one mask layer of the mask layer stack. Furthermore, the method comprises forming a strain-inducing semiconductor alloy in portions of the active region.

A still further illustrative method disclosed herein relates to forming a semiconductor device. The method comprises forming a shallow trench isolation structure in a semiconductor layer by using a hard mask, which laterally delineates an active region and which comprises a silicon dioxide layer formed on the semiconductor layer and a silicon nitride layer formed on the silicon dioxide layer. The method further comprises removing the silicon nitride layer selectively to the silicon dioxide layer and performing a well implantation process in the presence of the silicon dioxide layer. Additionally, the method comprises forming at least one P-channel transistor in the active region so as to comprise a silicon/germanium alloy in portions of the active region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques in which a superior topography for the shallow trench isolation may be accomplished by reducing material loss in a process phase prior to forming a strain-inducing semiconductor material. As will be explained later on in more detail, it is believed that the significant variation of transistor characteristics, which have incorporated therein a strain-inducing semiconductor alloy, may be caused by the height difference between the edge of the active region and the isolation structure, which may thus result in an inferior transistor performance of any transistor elements formed adjacent to an isolation structure, compared to transistors which are not laterally delineated by an isolation structure. Consequently, performance of a plurality of transistors provided in a single active region may be increased by reducing the difference between edge transistors and central transistors, while, at the same time, performance of transistors provided in a single active region may also be enhanced.

With reference to FIGS. 1c-1o, a conventional process strategy will be described in more detail so as to identify process steps which may result in an inferior performance of transistors having incorporated therein a strain-inducing semiconductor material. It should be appreciated, however, that any explanations or any theory provided herein is not to be considered as limiting the principles disclosed herein. The description of the conventional process flow as analyzed in accordance with the present disclosure, however, facilitates the identification of such steps in which significant material loss in the isolation structure may occur, irrespective of whether any further mechanisms may contribute to the significant transistor variations. Moreover, with reference to FIGS. 2a-2f and also referring to FIGS. 1c-1o, if appropriate, embodiments will be described in more detail, in which the material loss may be reduced, while, nevertheless, a high degree of compatibility with the well-established conventional process flow may be preserved.

Figure 1C:
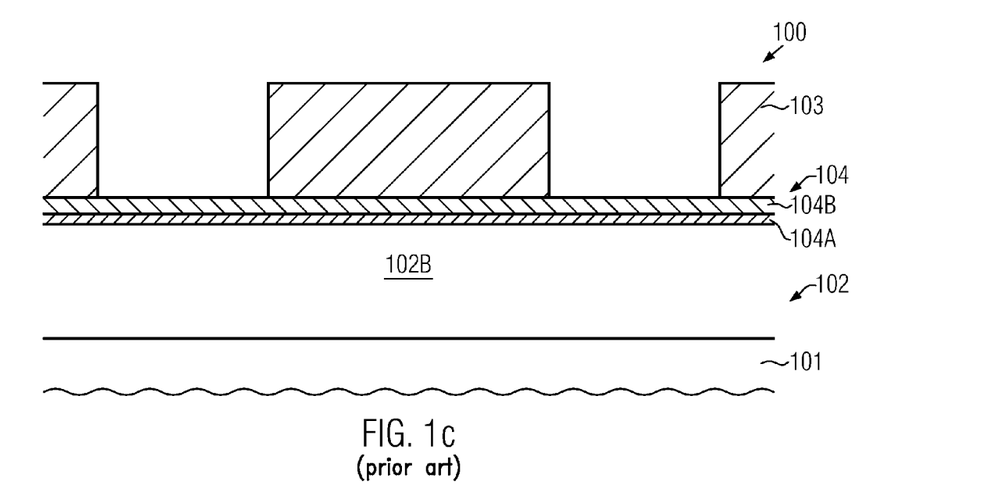
FIGS. 1c-1o schematically illustrate cross-sectional views of a semiconductor device including P-channel transistors during various manufacturing stages in forming a shallow trench isolation and a strain\-inducing semiconductor alloy, wherein it is believed that a significant loss of material in the isolation structure may result in a reduced transistor performance.

FIG. 1c schematically illustrates the device 100 in cross-sectional view in an early manufacturing stage. As illustrated, a mask layer stack 104 comprising a first silicon dioxide mask layer 104A and a second silicon nitride mask layer 104B is formed on the semiconductor layer 102, in combination with an etch mask 103, which may define the lateral position and size of a shallow trench isolation structure. Thus, the mask 103, for instance provided in the form of a resist mask, may also define the lateral size and position of any active region, wherein, for convenience, the active region 102B is indicated, which is to receive a single transistor element in a later manufacturing stage. The layers 104A and 104B may be formed on the basis of any appropriate deposition technique, such as plasma enhanced chemical vapor deposition (CVD), thermally activated CVD and the like, wherein a plurality of well-established process recipes are available for forming silicon dioxide and silicon nitride. Thereafter, the mask 103 may be formed on the basis of sophisticated lithography techniques. Thereafter, the mask 103 may be used during an etch process for patterning the mask layer stack 104 by etching through the layer 104B and finally etching through the layer 104A.

Figure 1D:
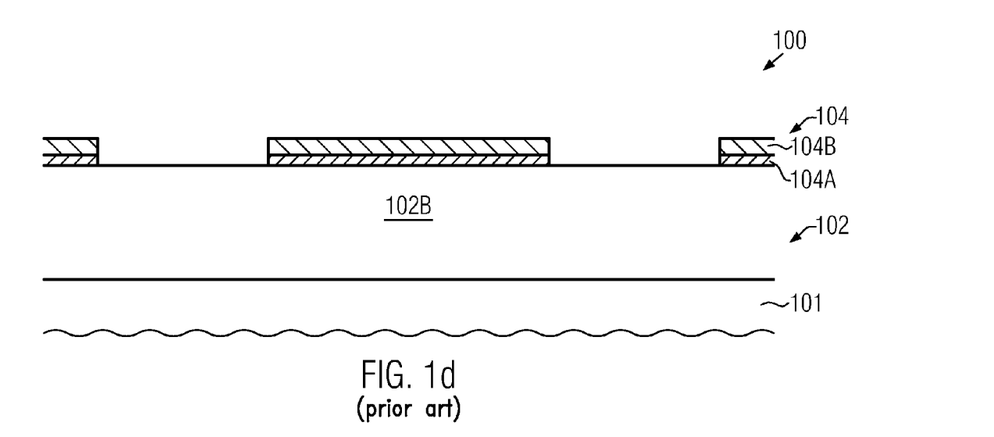

FIG. 1d schematically illustrates the device 100, wherein the mask layer 104 is patterned and may be used for a subsequent anisotropic etch process for etching silicon material selectively with respect to the second mask layer 104B. For this purpose, a plurality of plasma assisted etch recipes are available and may be used.

Figure 1E:
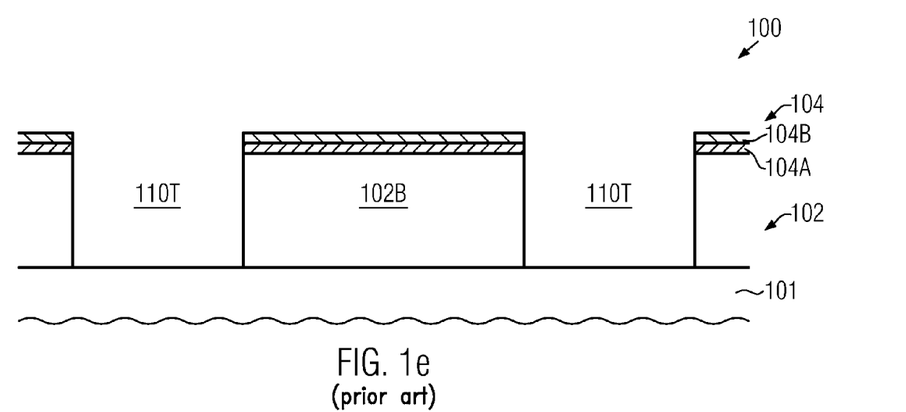

FIG. 1e schematically illustrates the device 100 with an isolation trench 110T, which may be formed so as to extend to a desired depth in an anisotropic etch process, in which the mask layer 104B may act as an etch stop material. Consequently, the etch process may be stopped on or in the layer 104B.

Figure 1F:
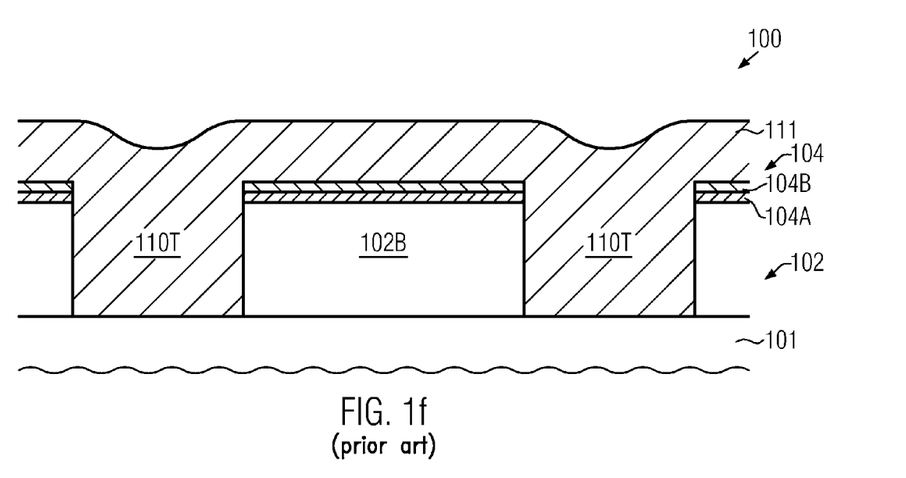

FIG. 1f schematically illustrates the device 100 with a dielectric fill material 111, such as silicon dioxide, formed in the trenches 110T and above the mask layer 104. To this end, well established CVD techniques having a desired high gap fill capability may be applied.

Figure 1G:
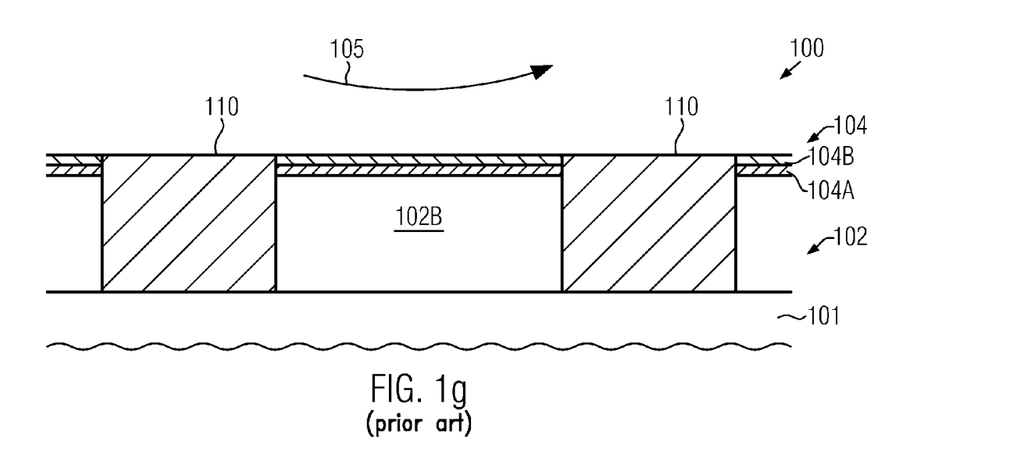

FIG. 1g schematically illustrates the device 100 during a polishing process 105 in order to remove any excess portion of the silicon dioxide layer 111 of FIG. 1f. It should be appreciated that silicon oxide material may be efficiently removed, for instance, by chemical mechanical polishing (CMP) using well-established process recipes, wherein appropriate slurry materials and process parameters are selected so as to obtain a high selectivity with respect to the silicon nitride material of the layer 104B. Consequently, during the removal process 105, the remaining portion of the material layer 104B may act as an efficient stop layer. Consequently, the isolation structure 110 is provided with a height level that may substantially correspond to the height level of the material 104B, except for a certain degree of "dishing."

Figure 1H:
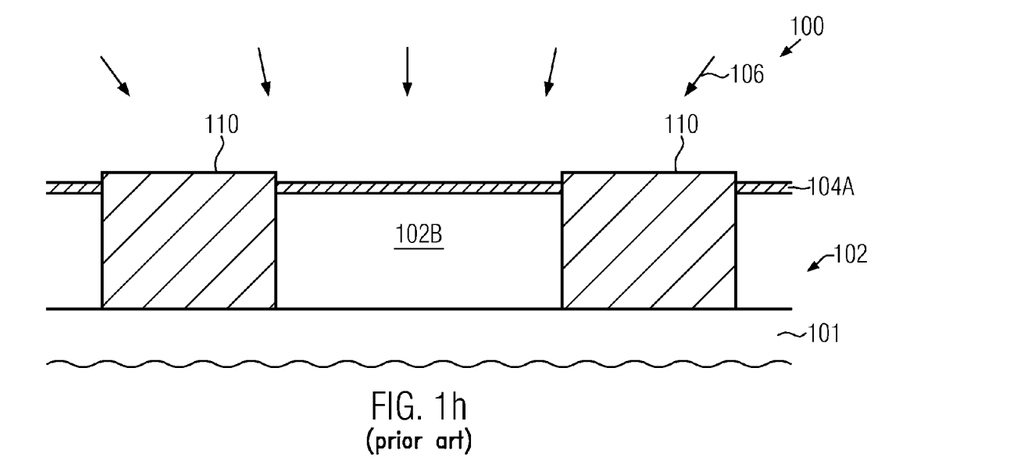

FIG. 1h schematically illustrates the device 100 during an etch process 106, for instance based on phosphoric acid and the like, in order to remove the remaining portion of the layer 104B (FIG. 1g), wherein the silicon dioxide layer 104A may be used as a stop material.

Figure 1I:
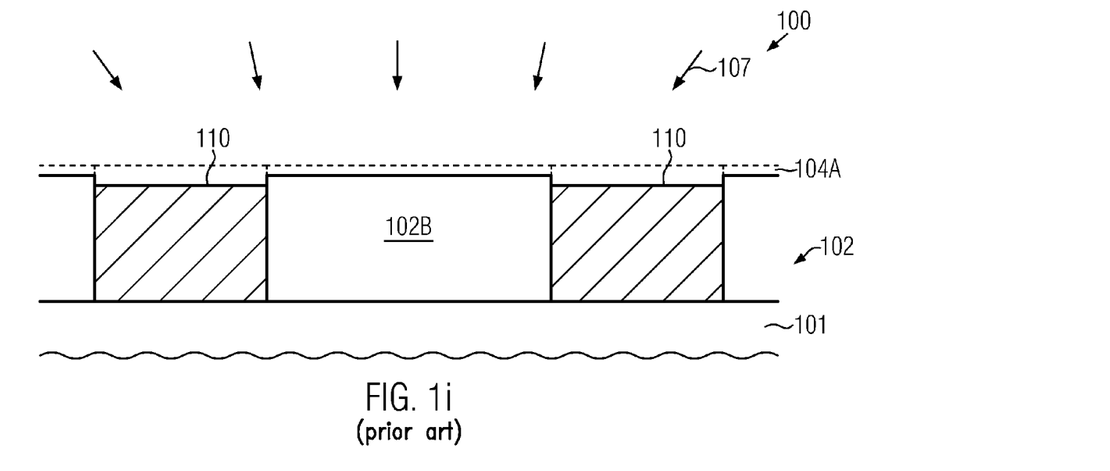

FIG. 1i schematically illustrates the device 100 during a further etch process 107, which is performed on the basis of diluted hydrofluoric acid, that is, a well-known chemical solution for efficiently removing silicon dioxide material selectively with respect to silicon material. Generally, in conventional concepts, the etch stop layer 104A is considered to be inappropriate for the further processing of the semiconductor device 100 and is, thus, removed during the process 107, during which a portion of the isolation structure 110 may also be removed, since appropriate over-etch times have been considered necessary in order to completely remove the layer 104A from any active region, such as the region 102b, across the entire device 100.

Figure 1J:
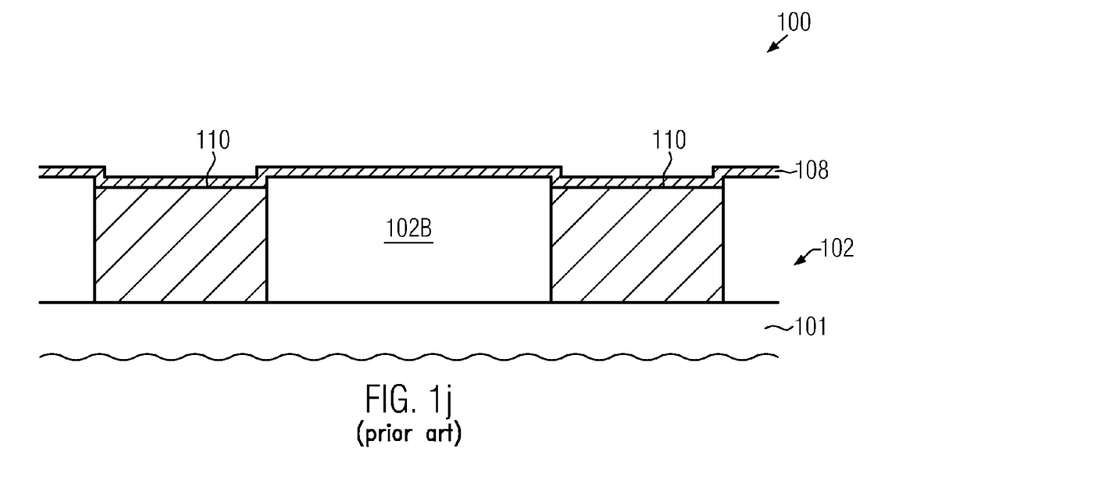

FIG. 1j schematically illustrates the semiconductor device 100 during a further advanced manufacturing stage, in which a buffer layer 108 is provided prior to the incorporation of any dopant species into the active region 102B and any other active regions of the device 100. The buffer layer 108 is typically provided in the form of a silicon dioxide material and may be provided with a thickness of 10 to several tens of nanometers so as to reduce implantation-induced damage at the surface areas of the active region 102B and also during any resist application and removal processes, as are typically required for providing the different well dopant species for transistors of different conductivity type and for different flavors of transistors of the same conductivity type, as is also discussed above.

Figure 1K:
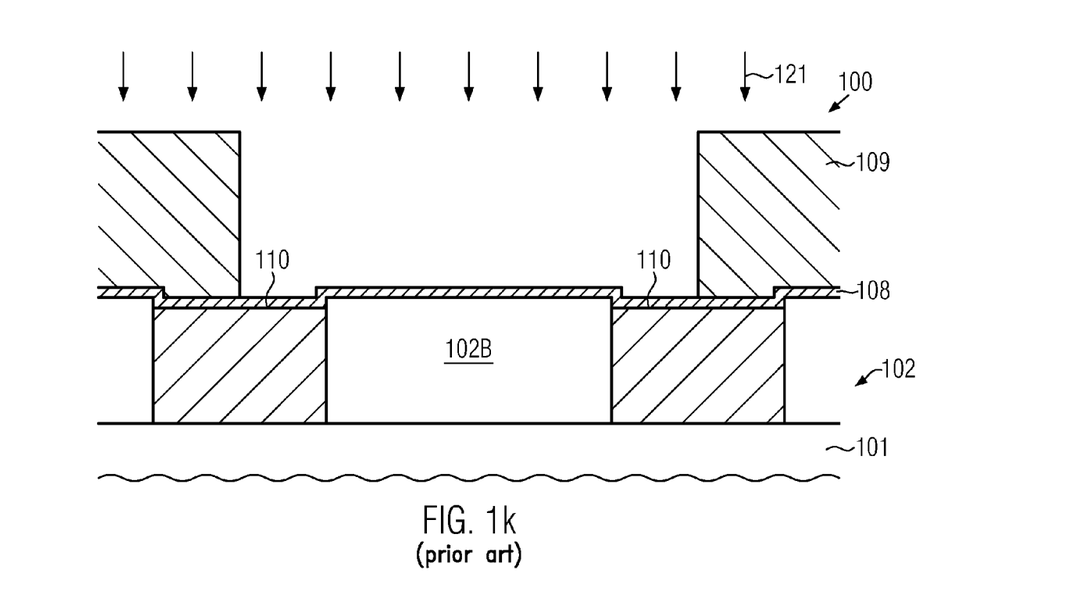

FIG. 1k schematically illustrates the device 100 during a sequence of implantation processes 121 based on appropriate implantation masks, such as a mask 109, in order to incorporate one or more dopant species into the active region 102B, while other active regions may be covered. Similarly, the sequence 121 may comprise additional implantation steps with implantation masks so as to cover the region 102B while exposing other active regions in order to obtain the desired basic transistor characteristics in each of the respective active regions. During the implantation sequence 121 and the corresponding processes for applying a resist mask and removing the same, the buffer layer 108 may provide superior integrity of the underlying active regions.

Figure 1L:
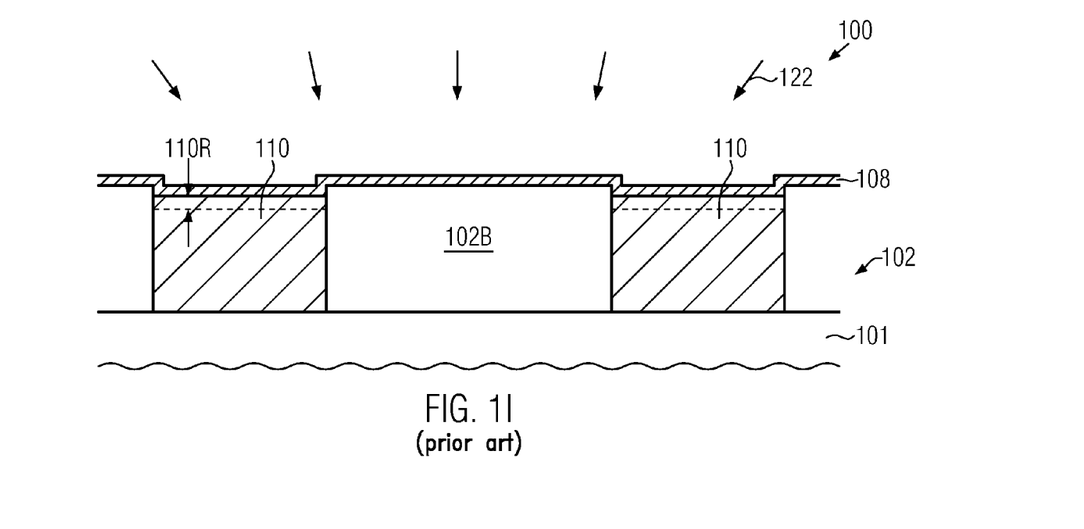

FIG. 1l illustrates the device 100 during a further etch process 122 performed on the basis of diluted hydrofluoric acid in order to remove the layer 108, which may also cause a significant loss of material in the isolation region 110, as indicated by 110R. Consequently, due to the etch processes 107 and 122, both of which are typically performed on the basis of hydrofluoric acid, a significant recessing of the isolation region 110 may be caused prior to providing a strain-inducing semiconductor alloy.

Figure 1M:
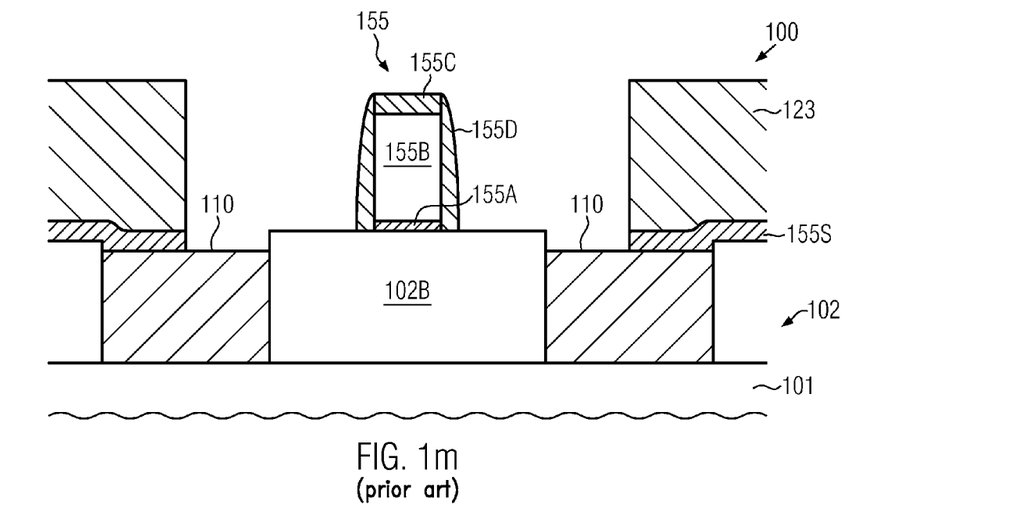

FIG. 1m schematically illustrates the semiconductor device 100 in a further advanced manufacturing stage. As illustrated, the gate electrode structure 155 is formed on the active region 102B and comprises a gate dielectric material 155A and an electrode material 155B, as previously discussed. Moreover, a dielectric cap layer 155C, such as a silicon nitride material, is formed on the silicon material 155B, while a sidewall spacer structure 155D provides the lateral confinement of the material 155B. The spacer structure 155D may comprise a silicon nitride material and the like. Furthermore, a spacer layer 155S may cover any other active regions of the device 100, in which the growth of the strain-inducing semiconductor alloy is not required. Furthermore, as shown, an etch mask 123, such as a resist mask, is formed so as to expose at least the active region 102B.

The device 100 as illustrated in FIG. 1m may be formed on the basis of the following processes. Materials for the layers 155A, 155B and 155C may be provided by deposition techniques, possibly in combination with oxidation processes, and, thereafter, the resulting layer stack may be patterned using sophisticated lithography and etch techniques, as is also previously discussed. Thereafter, the spacer layer 155S may be provided, for instance in the form of a silicon nitride material, possibly in combination with a thin etch stop layer (not shown), and, thereafter, the etch mask 123 may be formed on the basis of lithography techniques. Next, the spacer layer 155S, exposed above the active region 102B and a portion of the isolation structure 110 as defined by the etch mask 123, may be etched by anisotropic etch techniques, thereby forming the spacer element 155D of the gate electrode structure 155.

Figure 1N:
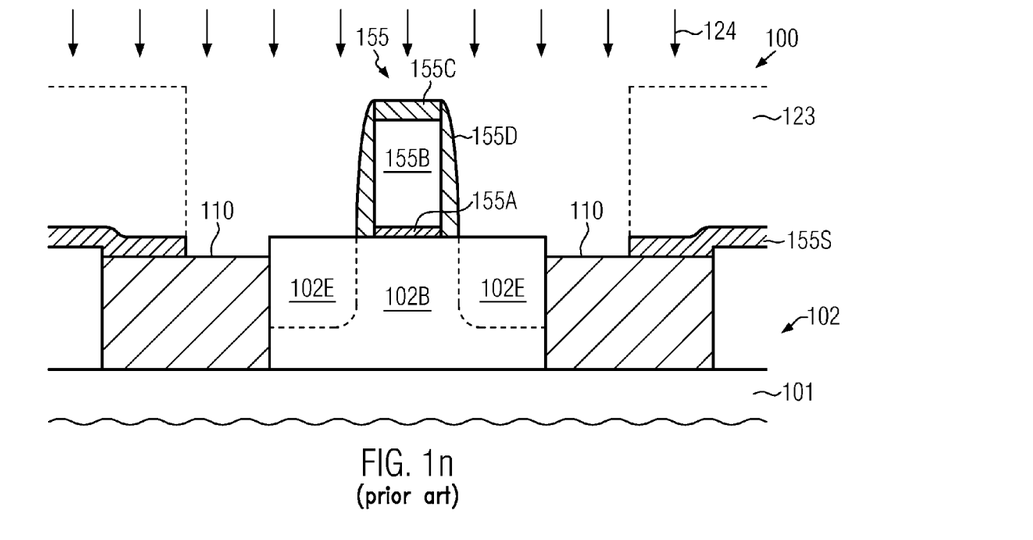

FIG. 1n schematically illustrates the semiconductor device 100 during an etch process 124, possibly in the presence of the mask 123, in order to form cavities 102E in the active region 102B, while a silicon electrode material 155B of the gate electrode structure 155 is protected by the dielectric cap layer 155C and the spacer structure 155D.

Figure 1O:
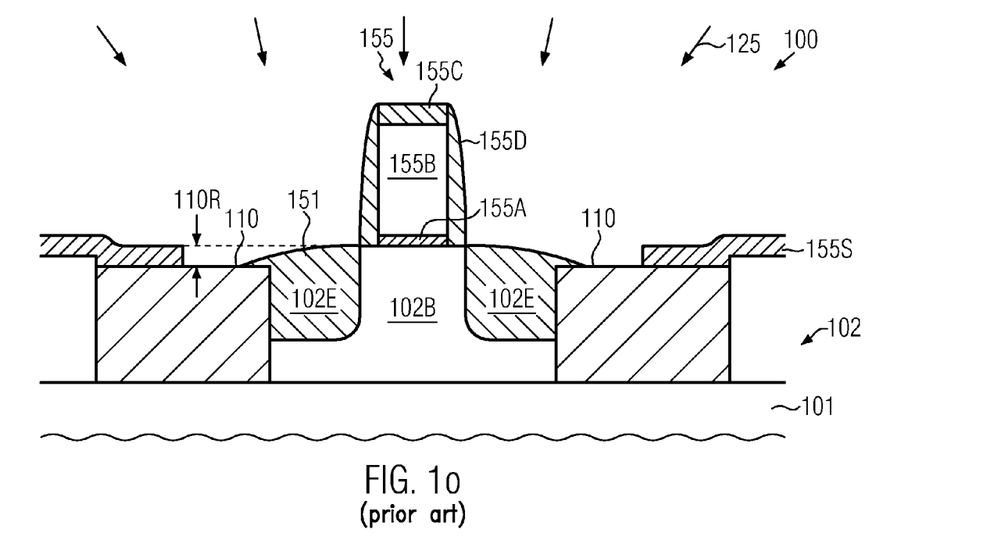

FIG. 1o schematically illustrates the device 100 in a further advanced manufacturing stage. That is, after forming the cavities 102E, the device 100 may be subjected to a cleaning process so as to prepare the exposed surface areas for a subsequent selective epitaxial growth process 125 in order to form the silicon/germanium material 151 in the cavities 102E. The corresponding cleaning process may additionally contribute to the recess 110R of the isolation structure 110, depending on the overall process strategy. During the selective epitaxial growth process 125, process parameters are selected such that a material deposition may occur on exposed crystalline surface areas, while a significant material adhesion to dielectric surface areas may be suppressed. During the growth of the material 151 in the final stage of the process 125, however, the recessed configuration of the structure 110 may result in a reduced height of the material 151 at the vicinity of the isolation region 110 compared to the area around the gate electrode structure 155, for instance since the material may also laterally grow due to the "missing" sidewall of the structure 110 due to the recess 110R.

Without intending to restrict the present disclosure to the following explanation, it is believed that the non-uniform topography of the material 151 in transistors at least on a side bordered by the isolation structure 110 may result in reduced performance compared to any transistors in which a substantially uniform topography for the strain-inducing semiconductor material 151 is obtained, such as transistors provided in a central region of an active region, which may comprise three or more transistor elements, as previously described with reference to FIG. 1a.

For this reason, superior process strategies may be provided, in which basically the well-established process strategy may be applied, as described above, while, at the same time, a reduced material loss and, thus, an improved topography of the isolation structure may be obtained.

Figure 2A:
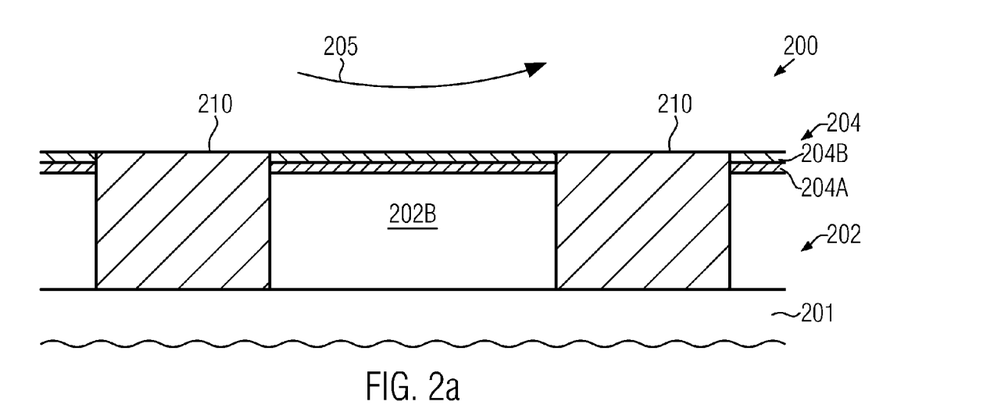
FIGS. 2a-2g schematically illustrate cross-sectional views of a semiconductor device during various manufacturing stages in forming an isolation structure and a transistor comprising a strain-inducing semiconductor material on the basis of a process strategy in which the loss of material in the isolation structure may be reduced, according to illustrative embodiments.

FIG. 2a schematically illustrates a semiconductor device 200 comprising a substrate 201 and a silicon-based semiconductor layer 202, in which an isolation structure 210 may laterally delineate a plurality of active regions, of which only one active region 202B is indicated in FIG. 2a. Moreover, in the manufacturing shown, a mask layer stack 204 may be provided and may comprise a first mask layer 204A, such as a silicon dioxide layer, and a second mask layer 204B, such as a silicon nitride layer. It should be appreciated that, for any components described so far, the same criteria may apply as previously explained with reference to the semiconductor device 100. Thus, with respect to specific characteristics and process concepts for forming the semiconductor device 200 as illustrated in FIG. 2a, it may be referred to the corresponding components and manufacturing strategies as described above. For example, the isolation structure 210 may be formed on the basis of a process strategy as described above, wherein, after refilling of corresponding isolation trenches with an appropriate dielectric material, such as a silicon dioxide material, a removal process 205, such as a CMP process, may be applied, thereby forming the isolation structure 210, while the second mask layer 204B may act as a stop material, as is also discussed above.

Thereafter, the layer 204B may be removed, as is also previously described, for instance by using any appropriate selective etch recipe, such as hot phosphoric acid and the like, in order to remove the layer 204B selectively with respect to the mask layer 204A, which may, thus, be used as an etch stop material.

Figure 2B:
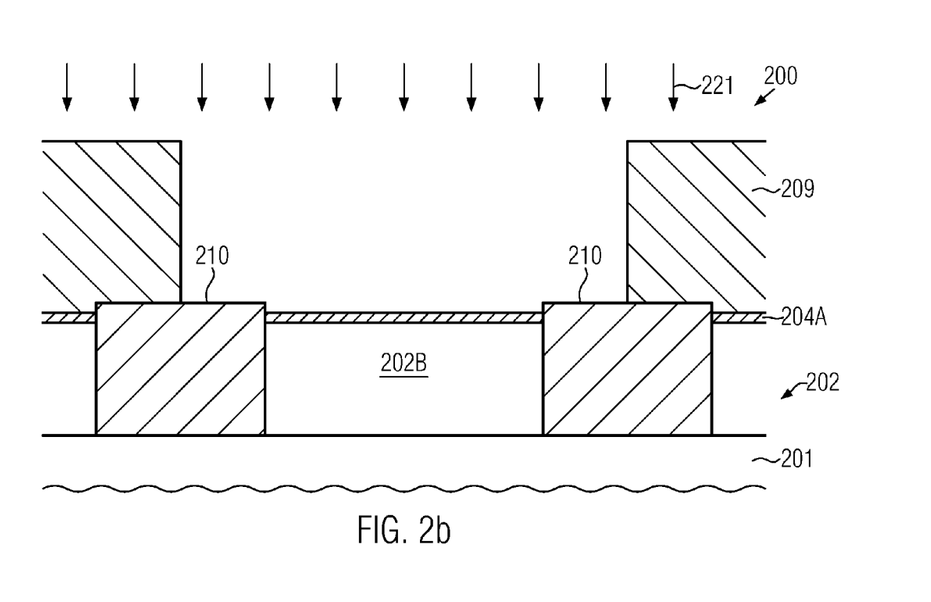

FIG. 2b schematically illustrates the semiconductor device 200 in a further advanced manufacturing stage according to some illustrative embodiments. According to the principles disclosed herein, it has been recognized that the mask layer 204A, although having experienced the previous process history, may be efficiently used as a buffer material during the further processing of the device 200. Thus, according to the illustrative embodiment shown in FIG. 2b, the layer 204A may be preserved and may be used as a buffer layer during an implantation sequence 221 performed on the basis of an appropriate masking regime so as to incorporate a well dopant species into the active region 202B and any other active region, wherein, for convenience, a single implantation mask 209 is shown in FIG. 2b. Thus, the mask layer 204A may provide superior integrity of the active regions, such as the region 202B, during the implantation sequence 221 and during any resist application and removal processes, as required for providing the well dopant species for the various different transistor types, as also discussed above. After the implantation sequence 221, the mask layer 204A may be removed by, for instance, hydrofluoric acid, as is also explained above, thereby creating a significantly reduced degree of topography, i.e. a reduced degree of material loss in the isolation structure 210 compared to the conventional process strategy, described above with reference to FIGS. 1c-1o. Consequently, the further processing may be continued on the basis of a significantly reduced recess in the isolation structure 210.

Figure 2C:
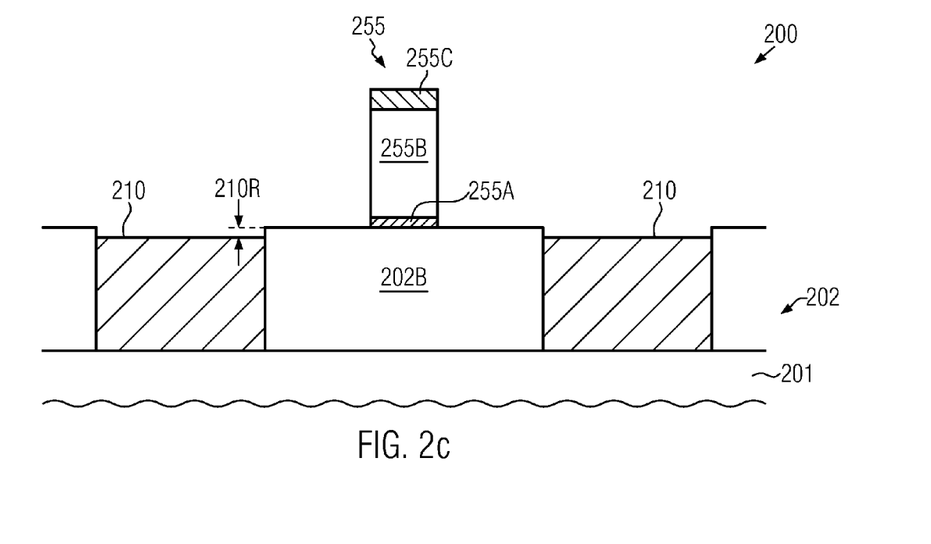

FIG. 2c schematically illustrates the device 200 in a further advanced manufacturing stage. As shown, a recess 210R of the isolation structure 210 caused by the removal of the layer 204A (FIG. 2b) may be significantly reduced compared to conventional strategy and may, thus, provide superior conditions during the subsequent processing, for instance for providing a gate electrode structure 255. The gate electrode structure 255 may comprise a gate dielectric material 255A, such as a silicon-based material, in combination with a silicon or any other semiconductor-based electrode material 255B and a dielectric cap material 255C, as is also previously explained. Thus, during the patterning of the gate electrodes 255 based on sophisticated lithography and etch techniques, the reduced lithography constraints, i.e., the reduced recess 210R, may provide superior conditions, thereby achieving superior uniformity of critical dimensions, such as the length of the gate electrode structure 255, independent of the actual length of the active region 202B. Consequently, the superior uniformity of the gate electrode structure 255 across the entire device 200 may efficiently contribute to a superior uniformity of the final device characteristics.

Figure 2D:
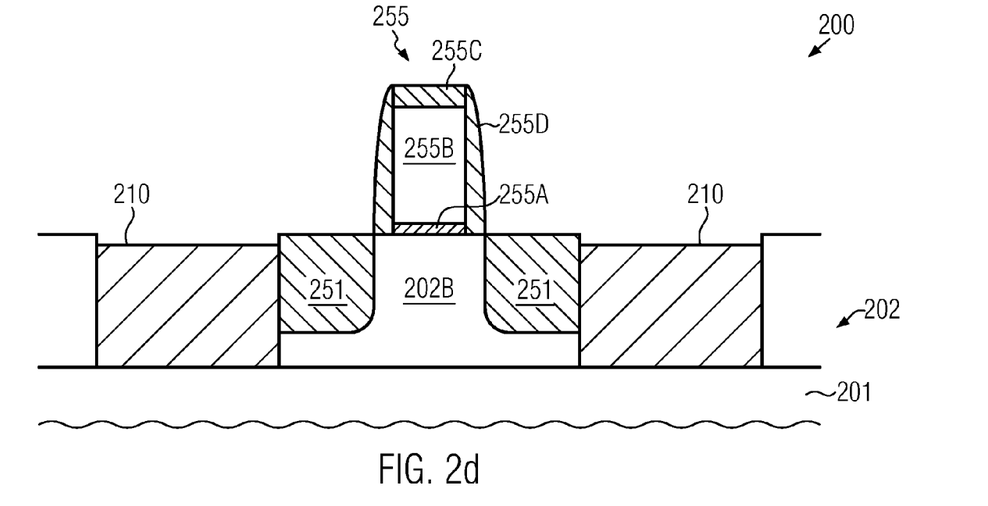

FIG. 2d schematically illustrates the device 200 in a further advanced manufacturing stage. As illustrated, the gate electrode structure 255 may comprise a sidewall spacer 255D, so as to reliably confine the material 255B in combination with the dielectric cap material 255C during a process sequence for providing a strain-inducing semiconductor material 251, such as a silicon/germanium material, a silicon/carbon material and the like. To this end, any appropriate process strategy may be applied, as is, for example, also explained above with reference to the device 100. That is, cavities may be formed in the active region 202B and may be subsequently refilled on the basis of a selective epitaxial growth process, wherein the isolation structures 210 may extend to a greater height compared to the conventional strategy, so that the epitaxial growth of the material 251 may advance with superior uniformity, even at a final phase of the deposition process. Thus, a more uniform topography of the material 251 may be obtained, which may, thus, result in superior transistor characteristics for devices provided within active regions of small length, such as in the active region 202B, while also providing superior uniformity of device characteristics in active regions comprising three or more transistors, as is also previously explained with reference to the semiconductor device 100, when referring to FIGS. 1a and 1b.

Figure 2E:
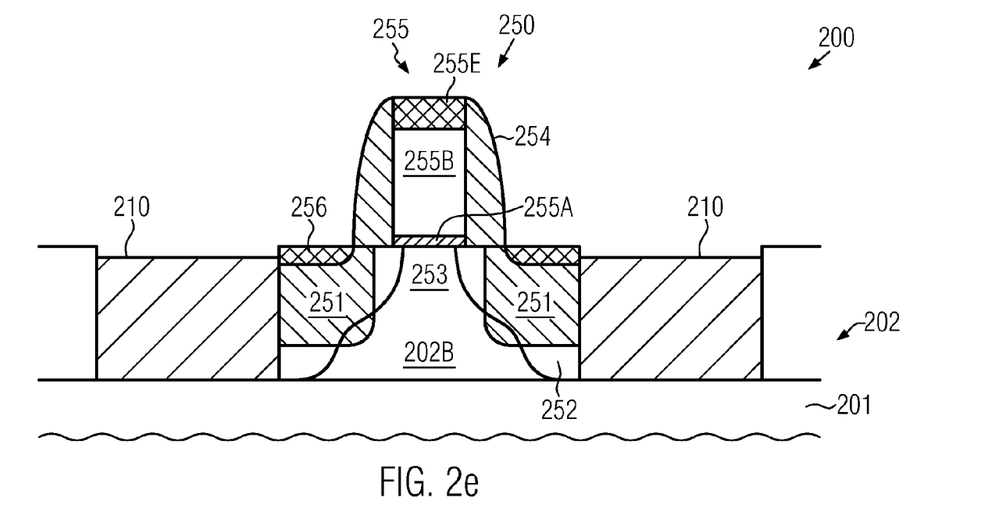

FIG. 2e schematically illustrates the semiconductor device 200 in a further advanced manufacturing stage. As shown, a transistor 250 may be provided in and above the active region 202B on the basis of the gate electrode structure 255 and the strain-inducing semiconductor material 251. Drain and source regions 252 may be provided in the active region 202B and may be laterally separated by a channel region 253, having strain conditions as provided by the material 251. Furthermore, metal silicide regions 256 may be provided in the drain and source regions 252 and a metal silicide region 255E may also be provided in the gate electrode structure 255. Additionally, a spacer structure 254 may be formed on sidewalls of the gate electrode structure 255. It should be appreciated that the spacer structure 254 may comprise any appropriate configuration and may also include the previously shown spacer structure 255D (FIG. 2d), if considered appropriate.

The semiconductor device 200 as illustrated in FIG. 2e may be formed on the basis of any appropriate process strategy, as is, for instance, also previously discussed.

Thus, by applying a process flow in which the material loss in the isolation structure 210 may be reduced compared to the conventional strategy, performance of the transistor 250 may be increased and at the same time variations in device performance across individual active regions including a plurality of transistors and across the entire device 200, i.e., across an entire semiconductor die, may be significantly reduced for transistors having incorporated therein the strain-inducing semiconductor material 251. In the embodiments described above, the material loss up to approximately 9 nanometers may be avoided by omitting the removal of at least one silicon dioxide based layer prior to the deposition of the strain-inducing semiconductor material 251. A corresponding reduction in material loss of the isolation structure 210 for transistors having a gate length of 50 nm and less may represent a significant improvement, while, at the same time, well-established materials and process strategies may be maintained to a high degree.

Figure 2F:
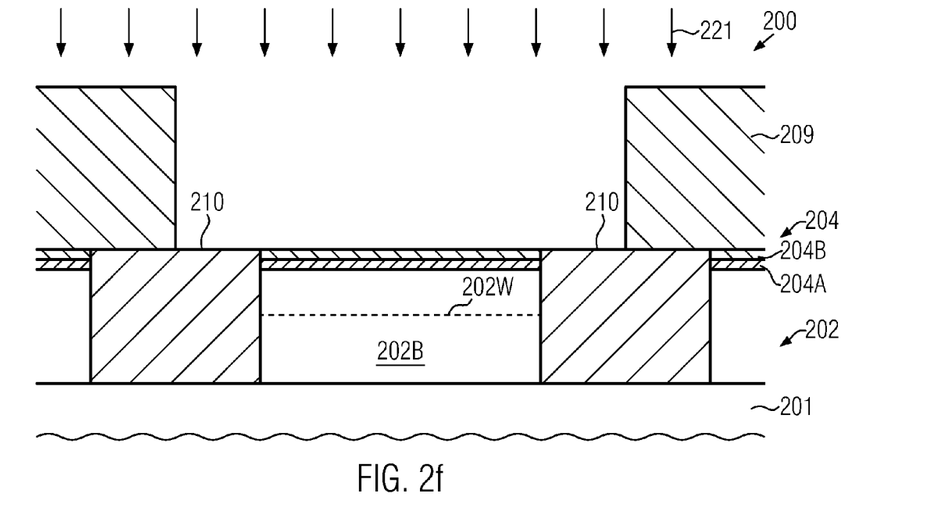

FIG. 2f schematically illustrates the semiconductor device 200 according to further illustrative embodiments. As illustrated, the device 200 comprises the mask layer stack 204, which may have been used for forming the shallow trench isolation 210, as discussed above. The layer stack 204 may, however, still comprise the layer 204b, i.e., any portion thereof after acting as a stop layer for removing any excess portion of the dielectric material for filling the isolation structure 210, as explained before. In this state, the implantation sequence 221 may be performed so as to introduce any well dopant species 202W on the basis of the implantation mask 209. Consequently, the layers 204B and 204A may act as efficient buffer materials during the implantation sequence 221, wherein the layer 204B may provide superior integrity during the various resist application processes and in particular during the various resist removal processes. In this case, the first mask layer 204A may be provided with a reduced thickness, such as approximately 10 nanometers and less, since the layer 204A may only be used as an etch stop material for removing the layer 204B, also having a reduced thickness due to the previous process history, thereby also reducing the amount of hydrofluoric acid that is to be used for removing the layer 204A. Consequently, in this case, an even further reduced material loss may be caused in the isolation structures 210, thereby contributing to an even further enhanced surface topography prior to forming the strain-inducing semiconductor material.

Figure 2G:
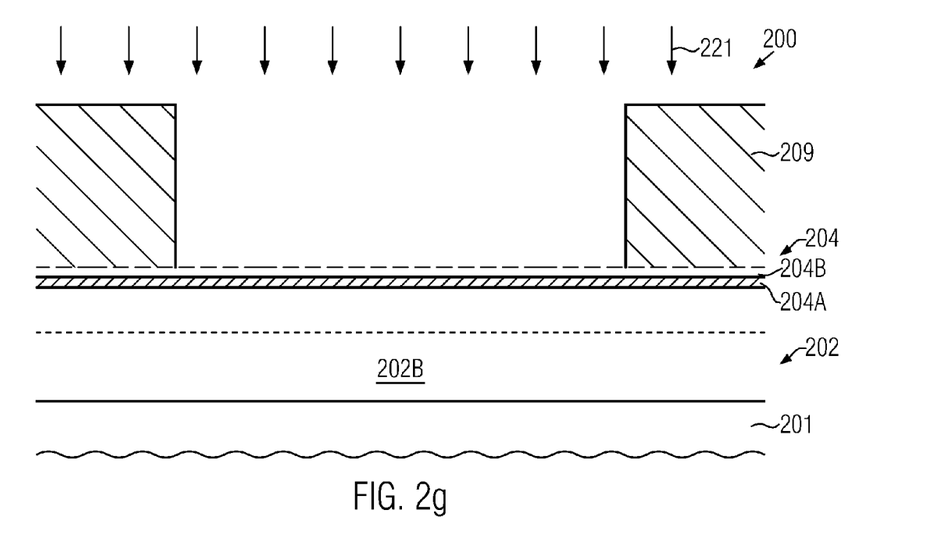

FIG. 2g schematically illustrates the semiconductor device 200 according to further illustrative embodiments. As shown, the sequence of implantation processes 221, for instance using the implantation mask 209, may be performed prior to fabricating any shallow trench isolation structures. To this end, the mask layer 204A may be used as an efficient buffer layer, thereby providing superior uniformity of the material 204A during the sequence 221. In other illustrative embodiments, as illustrated, the second mask layer 204B may be provided and may be used, in combination with the layer 204A, as a buffer layer during the implantation sequence 221. Also in this case, the layer 204A may be provided with reduced thickness, while the layers 204B, 204A may have superior uniformity during the sequence 221, since any etch steps and CMP steps for forming the trench isolation structures are applied in a later manufacturing stage. Consequently, also in these embodiments, at least one removal process and the application of one additional buffer layer, as used in the conventional strategy, may be omitted, thereby contributing to superior transistor uniformity, as explained above.

As a result, the present disclosure provides manufacturing techniques in which a superior topography of the trench isolation structure may be accomplished in a process phase prior to the deposition of a strain\-inducing semiconductor alloy. As a consequence, the variability, for instance of P-channel transistors having incorporated therein a silicon/germanium alloy, may be reduced, for instance in individual active regions and across the entire semiconductor die, thereby enabling superior targeting and classification of semiconductor devices with advanced transistors, which may be provided on the basis of well-established gate dielectrics and electrode materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    forming a mask layer stack on a semiconductor layer;
    forming an etch mask from said mask layer stack;
    forming a shallow trench isolation structure in said semiconductor layer by using said etch mask so as to laterally delineate an active region in said semiconductor layer;
    incorporating a well dopant species into said active region in the presence of at least one mask layer of said mask layer stack; and
    forming a strain-inducing semiconductor alloy in portions of said active region.

2. The method of claim 1, wherein forming said mask layer stack comprises forming a first mask layer on said semiconductor layer and forming a second mask layer on said first mask layer, wherein said first and second mask layers differ in material composition.

3. The method of claim 2, wherein forming said shallow trench isolation structure comprises forming a trench in said semiconductor layer by using said second mask layer as an etch stop material.

4. The method of claim 3, wherein forming said shallow trench isolation structure further comprises filling said trench with a dielectric material and removing an excess portion of said dielectric material by using said second mask layer as a stop layer.

5. The method of claim 4, further comprising removing said second mask layer selectively to said first mask layer.

6. The method of claim 1, wherein incorporating a well dopant species into said active region is performed after forming said shallow trench isolation structure.

7. The method of claim 2, wherein said well dopant species is incorporated into said active region in the presence of said first and second mask layers.

8. The method of claim 7, wherein said dopant species is incorporated into said active region prior to forming said shallow trench isolation structure.

9. The method of claim 1, further comprising forming a gate electrode structure on said active region prior to forming said strain-inducing semiconductor alloy in portions of said active region.

10. A method of forming a semiconductor device, the method comprising:
    forming a shallow trench isolation structure in a semiconductor layer by using a hard mask, said hard mask laterally delineating an active region and comprising a silicon dioxide layer formed on said semiconductor layer and a silicon nitride layer formed on said silicon dioxide layer;
    removing said silicon nitride layer selectively to said silicon dioxide layer;
    performing a well implantation process in the presence of said silicon dioxide layer; and
    forming at least one P-channel transistor in said active region so as to comprise a silicon/germanium alloy in portions of said active region.

11. The method of claim 10, wherein said at least one P-channel transistor is formed so as to comprise a gate electrode structure comprising silicon and a silicon dioxide based gate dielectric material with a gate length of 50 nm or less.

* * * * *